United States Patent [19]
Krishnaswamy

[11] Patent Number: 5,372,862
[45] Date of Patent: Dec. 13, 1994

[54] COATING TECHNIQUE FOR SYNCHROTRON BEAM TUBES

[76] Inventor: Jayaram Krishnaswamy, 137 Tennyson Dr., Plainsboro, N.J. 08536

[21] Appl. No.: 135,566

[22] Filed: Oct. 14, 1993

[51] Int. Cl.⁵ .............................. B05D 7/22
[52] U.S. Cl. .................... 427/596; 118/716; 118/718; 118/719; 427/237; 427/238; 427/249; 427/255.5; 427/294; 427/586
[58] Field of Search ............ 427/596, 586, 249, 255.5, 427/294, 237, 238; 118/716, 718, 720

Primary Examiner—Bernard Pianalto
Attorney, Agent, or Firm—Pollock, Vande Sande & Priddy

[57] ABSTRACT

A coating technique for beam tubes which employs a laser to ablate a target material and produce a plasma plume containing ions of the target material which adhere to the inner wall surface of the tube forming a thin film. The device employed in the coating process includes a pulse laser, a turning mirror used to direct the laser radiation, a window attached to tubing whose function is to evacuate the setup and to support a rail on which a carriage carrying the target material and optical elements for focusing the laser light onto the targets are mounted. During the coating process, the beam tube and the rail support tubes are evacuated to a lower pressure to remove ambient air. The apparatus is then filled with an inert gas. The laser is pulsed for a predetermined duration to ablate the target material for coating the vicinal surfaces of the beam tube. The carriage is then translated to a new position and the process is repeated until the carriage has travelled the entire beam tube and the inner surface wall is coated.

6 Claims, 1 Drawing Sheet

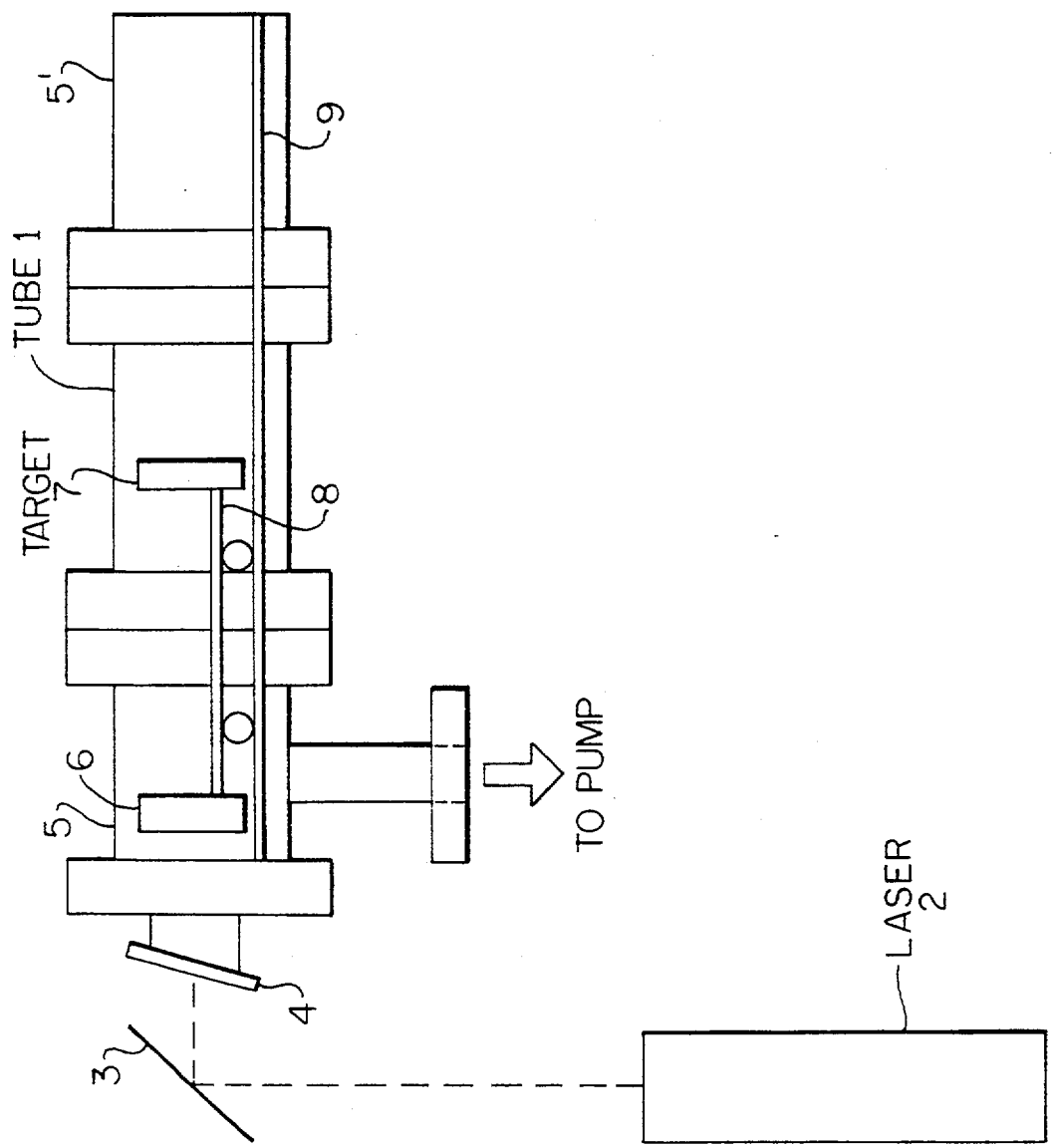

COATING TECHNIQUE FOR SYNCHROTRON BEAM TUBES

FIELD OF THE INVENTION

The present invention relates to beam tubes, and more particularly to reducing photo desorption from synchrotron beam tube structures.

BACKGROUND OF THE INVENTION

The novel coating technique described in this disclosure reduces photo desorption from the inner surfaces of synchrotrons and related devices. Synchrotron radiation (photons) hitting the inner surfaces of synchrotron beam tubes and RF cavities embedded in synchrotons releases gases by desorption. This increases the pressure and reduces the beam lifetime due to scattering. Also, ions produced by the interaction of beam electrons with released gas get trapped in the potential well and perform stable/unstable oscillations under the action of coulomb forces of the bunches—causing beam neutralization. Another deleterious effect of desorption is the reduction in the breakdown strength of the RF electrical field—sustaining gaps of RF cavities used in the synchrotron and leading to diminished performance. This problem may be quite serious in compact, high energy, superconducting synchrotrons where space limitations in regions of high photon flux impose severe restrictions on pumping.

BRIEF DESCRIPTION OF THE PRESENT INVENTION

RF and DC discharge coating techniques are being experimented to cover the inner surfaces of beam tubes and photon-irradiated surfaces with low atomic weight materials, as well as metals such as Cu and gold. The novel coating technique described herein is well suited for coating the inner surfaces of beam tubes. The proposed novel coating process produces mechanically strong, adherent, low atomic weight to medium resistance, conformal coatings on virtually any kind of surface at low coating temperatures. The coating is hydrogen free and should be thermally stable to at least ~400° C. These properties are hard to match from the RF and DC discharge coating processes which are known to produce thermally degradable, insulating films with substantial hydrogen content.

BRIEF DESCRIPTION OF THE FIGURE

The above-mentioned objects and advantages of the present invention will be more clearly understood when considered in conjunction with the accompanying drawing, in which:

the FIGURE is a schematic representation of the present invention.

DETAILED DESCRIPTION OF THE INVENTION

The proposed laser coating process may be described with reference to the FIGURE. It is assumed that the beam tube 1 receives its usual cleaning treatment prior to the coating process. This may include several stages of vapor degreasing, detergent cleaning, etching, rinsing operations including glow discharge cleaning. The laser deposition process itself may be carried out in the presence of a suitable inert gas at a pressure in the range of fractions of a millitorr to several torr. The light output of a pulsed laser 2 is concentrated by optical elements and guided to the surface of a suitable target material 7 such as carbon or boron. The optical energy density in the laser spot is such that the target material ablates and produces a plasma plume containing ions of the target material which propagates, expanding laterally. These ions get neutralized on the wall surface forming a thin film with excellent adhesion having properties of the parent target material. The film bonding is excellent and conformal, i.e., it evenly coats over the topography of the wall surface however irregular it may be.

The proposed method of film coating lends itself easily for coating the inside surface of a beam tube. The device consists of light concentrating elements and the target mounted on a carriage 8 which is pulled inside the beam tube. The carriage may also carry such devices as lenses, fiber bundles, etc., to guide the laser spot onto the target surface. The laser which is positioned outside the beam tube forms part of an optical system consisting of mirrors, windows, beam-defining apertures, etc., so as to bring in measured light intensity onto the target surface. The film coating process may involve mechanically positioning the target with respect to the ablating laser spot so that a fresh surface is exposed after a predetermined time of exposure to the laser. The laser is pulsed with frequency of pulsations dependent on the grade of film required. The coating process is terminated as soon as the whole beam tube is coated evenly to the desired thickness. This may be verified/calibrated a priori using witness plates inside the beam tube.

One embodiment of the coating strategy may be explained with reference to the FIGURE. Beam tube 1 to be coated is prepared as explained earlier. Pulsed laser 2 is of suitable energy and wavelength (e.g. Argon Fluoride Excimer Laser at 193 mm providing about 1 J/pulse or a Nd-glass laser, short pulse with 1 J/pulse at 1.06 $\mu$m). A turning mirror 3 is used to direct the laser radiation in a chosen direction. Tubing sections 5 and 5' with their flanges support rail 9. A window 4 is attached to tubing 5, the window serving to evacuate the entire set up as well as admitting laser light. An optical element 6 (in its simplest embodiment, a converging lens) focusses the laser light onto the target 7 which is for the purposes of this disclosure a low atomic weight material including composites of low atomic weight materials. The optical element 6 as well as the target 7 are mounted on a carriage 8 which can be translated over the rail 9 across the beam tube. The apparatus shown in the FIGURE can coat straight sections of beam tubes, but may be modified for curved geometries using flexible optical elements for light guidance, in which case the wavelength of light used will be the one which can be transmitted through optical fibers more easily.

A typical coating procedure will be described. The apparatus is set up as shown in the FIGURE. The target material and the optical element are mounted on the rail. The beam tube and the rail support tubes are evacuated to a low pressure by means of a roughing pump/turbo molecular pump combination so as to remove ambient air. The apparatus is then filled with high purity argon or helium to a pressure in the range of fractions of millitorr to several torr. The properties of the film are pressure dependent. The laser is then turned on for a predetermined duration. The energy in the focussed spot on the target is sufficient to ablate the target and the ablated material coats the vicinal surfaces of the beam tube. The carriage is then translated to a new position and the laser is turned on again. This process may be repeated until such time that the carriage arrives in the support tube on the other side of the beam tube. In another embodiment the laser repetition rate and the carriage motion are predetermined and synchronized so that the whole process once set up is continuous and automatic.

Accordingly, as will be appreciated from an understanding of the described invention, an efficient and reliable means is provided for coating the interior wall of a beam tube, such as a synchrotron tube. With some modifications. Other structures such as inner walls of an RF cavity can also be coated.

It should be understood that the invention is not limited to the exact details of construction shown and described herein for obvious modifications will occur to persons skilled in the art.

I claim:

1. A system for coating the interior wall of a beam tube, comprising:
    a source of coherent light;
    means for directing the light along a tube axis;
    a target of material, selected from the group consisting of carbon and boron, and of composites of these elements, located within the tube;
    a lens located within the tube for focusing the light onto the target;
    carriage means located in the tube for mounting the lens and the target in spaced relation from one another:
    rail means located in the tube for guiding movement of the carriage means along the tube axis;
    impingement of the light on the target causing its ablation and formation of a coating of the material on an interior tube wall.

2. The system set forth in claim 1 wherein the source is a laser.

3. The system set forth in claim 1 wherein the light directing means includes at least one mirror for reflecting light emitted from the laser along a direction coincident with the tube axis.

4. A system for coating the interior wall of a beam tube, comprising:
    a pulsed laser for generating coherent light;
    at least one mirror for reflecting light emitted from the laser along a direction coincident with a tube axis;
    a target of material, selected from the group consisting of carbon and boron, and of composites of these elements, located within the tube;
    a lens located within the tube for focusing the light onto the target;
    carriage means located in the tube for mounting the lens and the target in spaced relation from one another;
    rail means located in the tube for guiding movement of the carriage means along the tube axis;
    impingement of the light on the target causing its ablation and formation of a coating of the material on an interior tube wall.

5. A method for coating the interior of a beam tube comprising the steps:
    generating a beam of coherent light;
    directing the light along a tube axis;
    positioning a target of material, selected from the group consisting of carbon and boron, and of composites of these elements, within the tube;
    positioning a lens within the tube for focusing the light onto the target;
    spacing the lens and target in spaced relation to one another;
    moving the lens and target along the tube axis, in maintained spaced relation relative to one another; and
    impinging directed light on the target causing its ablation and formation of a coating of the material on an interior robe wall.

6. The method set forth in claim 5 wherein the coherent light is pulsed.

* * * * *